United States Patent
Staszewski et al.

(10) Patent No.: US 7,006,813 B2
(45) Date of Patent: Feb. 28, 2006

(54) EFFICIENT CHARGE TRANSFER USING A SWITCHED CAPACITOR RESISTOR

(75) Inventors: Robert B. Staszewski, Garland, TX (US); Khurram Muhammad, Dallas, TX (US); Chih-Ming Hung, McKinney, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 262 days.

(21) Appl. No.: 10/147,784

(22) Filed: May 16, 2002

(65) Prior Publication Data

US 2003/0040294 A1 Feb. 27, 2003

Related U.S. Application Data

(60) Provisional application No. 60/348,902, filed on Oct. 26, 2001, provisional application No. 60/313,772, filed on Aug. 20, 2001, provisional application No. 60/312,602, filed on Aug. 15, 2001.

(51) Int. Cl.
*H04B 1/26* (2006.01)

(52) U.S. Cl. .................... 455/323; 455/313; 455/324; 323/281

(58) Field of Classification Search ................ 455/325, 455/313, 323, 324, 334; 323/280, 281, 282; 327/277, 278, 94
See application file for complete search history.

(56) References Cited

U.S. PATENT DOCUMENTS

| 5,969,513 A | 10/1999 | Clark |
| 6,094,037 A * | 7/2000 | Pricer .......................... 323/280 |
| 2003/0080889 A1 | 5/2003 | Muhammad et al. |
| 2003/0083033 A1 | 5/2003 | Staszewski et al. |
| 2003/0083035 A1 | 5/2003 | Staszewski et al. |
| 2003/0119472 A1 * | 6/2003 | Das ............................ 455/325 |

* cited by examiner

*Primary Examiner*—Edward F. Urban
*Assistant Examiner*—Blane J. Jackson
(74) *Attorney, Agent, or Firm*—Ronald O. Neerings; James Wade Brady, III; Frederick J. Telecky, Jr.

(57) ABSTRACT

The application of a non-zero voltage offset to rotating capacitors 1111 and 1112 permit the use of a single positive voltage supply. However, the precharging of the rotating capacitors 1111 and 1112 is power inefficient. A power efficient and low-noise precharging operation is realized through the sharing of the charge on a feedback capacitor 1075 and 1080 that is significantly larger than the rotating capacitors 1111. Once a precharging operation is complete, the charge on the feedback capacitor 1075 and 1080 is refreshed from its residual charge level (rather than zero charge level) to a desired charge level.

43 Claims, 10 Drawing Sheets

EFFICIENT CHARGE TRANSFER USING A SWITCHED CAPACITOR RESISTOR

This application claims priority to provisional applications Ser. No. 60/312,602, filed Aug. 15, 2001, and Ser. No. 60/313,772, filed Aug. 20, 2001 and Ser. No. 60/348,902, filed Oct. 26, 2001. Each of these provisional applications is assigned to the assignee of this application and is also incorporated herein by reference as if each of the applications was reproduced in its entirety herein.

FIELD OF THE INVENTION

This invention relates generally to wireless communications systems, and particularly to reduce power consumption and noise generation in a wireless transceiver by utilizing charge transfer via a switched capacitor resistor.

BACKGROUND OF THE INVENTION

Discrete-time radio frequency (RF) is a newly emerging field in wireless digital communications wherein analog RF signals that are transmitted over-the-air are directly sampled into a discrete-time sample stream suitable for digital signal processing. A typical wireless digital communications device would use analog filters, duplexers, mixers, analog-to-digital converters (ADC), etc. to convert the analog RF signals into a digital data stream that is suitable for digital signal processing. Unfortunately, analog circuit components, especially components such as capacitors, inductors, resistors, etc., necessary for the analog filters are difficult to integrate into an integrated circuit. This is especially true for the precise values of these components required for use in filters. Of course, it is the desire of the manufacturer to maximize the degree of integration for the wireless transceivers (or receiver). This is because the more highly integrated a wireless transceiver can become, the lower the production costs for the transceiver and the transceiver will typically use less power during operation.

Discrete-time RF involves the direct conversion of the analog RF signal into discrete-time sample stream through the use of a direct sampling mixer, without having to undergo any intermediate analog filtering, downconversion, etc. An example of a direct RF sampling mixer is one that uses current to perform its sampling. The current-mode direct sampling mixer converts the received analog RF signal into a current that is then integrated by a sampling capacitor. The charge on the sampling capacitor is then periodically read to produce the discrete-time sample stream.

After reading the charge on the sampling capacitor, it is common practice to reset the charge on the sampling capacitor back to zero and/or to place a bias voltage value on the sampling capacitor. A reason for doing so is to prevent the accumulation of charge during the sampling phase to saturate (or deplete) the charge storage capacity of the sampling capacitor, thus resulting in loss of information. For example, should there be a relatively large charge already on the sampling capacitor when it begins to accumulate charge during the integrating phase, it is possible for the accumulated charge when combined with the existing charge to be above the maximum (or be below the minimum) amount of charge that may be stored on the sampling capacitor. Once the sampling capacitor becomes saturated or depleted, information is lost.

One commonly used technique for resetting the sampling capacitor is to short the sampling capacitor to electrical ground to remove any charge from the sampling capacitor and then applying a known current to the sampling capacitor for a known amount of time. This develops a known voltage onto the sampling capacitor. The known voltage is commonly referred to as a bias voltage and the operation of placing the bias voltage onto the sampling capacitor is known as a precharge operation.

A disadvantage of this technique is the amount of power consumed in bringing the sampling capacitor up to the bias voltage value. Each time that the sampling capacitor is brought from zero volts to the bias voltage value, a significant amount of current is consumed. If the precharge operation occurred only infrequently, then it is possible to overlook the power consumption. However, the precharge operation occurs after each sample is read out from the sampling capacitor and depending on the sampling rate, the precharge operation can occur very frequently. This leads to the consumption of a considerable amount of power. In many applications, such as portable and battery powered radios, power consumption is of vital concern and should be minimized when possible.

A need has therefore arisen for a method and apparatus to bring the sampling capacitor to a prespecified bias voltage value with minimum power consumption.

SUMMARY OF THE INVENTION

In one aspect, the present invention provides a method for providing a charge to a charging capacitor comprising the steps of applying a first charging current to the charging capacitor for a first period of time, to store a first charge on the charging capacitor, using the charging capacitor to share the first charge with a sampling capacitor, and leaving a residual charge on the charging capacitor, maintaining the residual charge on the charging capacitor after the using step, and applying a second charging current to the charging capacitor for a second period of time to bring the charge on the charging capacitor from the residual charge to a second charge.

In another aspect, the present invention provides a method for precharging a sampling capacitor comprising the steps of placing a first charge on a charging capacitor, coupling the charging capacitor to the sampling capacitor, such that the first charge on the charging capacitor is shared with the sampling capacitor, and such that a residual charge is left on the charging capacitor, decoupling the charging capacitor after charge sharing is complete, and restoring the charge on the charging capacitor from the residual charge back to a level equal to a second charge.

In yet another aspect, the present invention provides a circuit for precharging a rotating capacitor comprising a feedback control unit (FCU), the FCU containing circuitry to measure a direct current (DC) offset present in a signal stream, a precharge unit coupled to the FCU, the unit comprising a digital-to-analog converter (DAC) coupled to the FCU, the DAC containing circuitry to convert commands from the FCU into a charging current, a feedback capacitor coupled to the DAC, the feedback capacitor to hold a charge by integrating the charging current, the circuit further comprises a bank of rotating capacitors coupled to the precharge unit, the bank of rotating capacitors to sample a radio frequency (RF) current to provide the signal stream; wherein the bank of rotating capacitors is periodically coupled to the precharge unit and the charge on the feedback capacitor is shared with each rotating capacitor in the bank of rotating capacitors, providing a charge on each of the rotating capacitors, the charge sharing with the bank of rotating capacitors depletes a portion of the charge on the feedback capacitor, and wherein the charge on the feedback capacitor is refreshed to a second charge level with the charging current from the DAC.

In another aspect, the present invention provides a radio receiver comprising a radio frequency (RF) input to receive RF signals, a current-mode sampling mixer coupled to the RF input, the mixer comprising a feedback control unit (FCU), the FCU containing circuitry to measure a direct current (DC) offset present in a signal stream, a precharge unit coupled to the FCU, the unit comprising a digital-to-analog converter (DAC) coupled to the FCU, the DAC containing circuitry to convert commands from the FCU into a charging current, a feedback capacitor coupled to the DAC, the feedback capacitor to hold a charge by integrating the charging current, the FCU further comprises a bank of rotating capacitors coupled to the precharge unit, the bank of rotating capacitors to sample a radio frequency (RF) current to provide the signal stream, the mixer further comprises a signal processing unit coupled to the mixer, the signal processing unit containing circuitry to process the signal streams produced by the mixer and create user usable data; wherein the bank of rotating capacitors is periodically coupled to the precharge unit and the charge on the feedback capacitor is shared with each rotating capacitor in the bank of rotating capacitors, providing a charge on each of the rotating capacitors, wherein the charge sharing with the bank of rotating capacitors depletes a portion of the charge on the feedback capacitor, and wherein the charge on the feedback capacitor is refreshed to a second charge level with the charging current from the DAC.

In another aspect, the present invention provides a circuit comprising a switched current source to produce a controllable charging current, a pair of feedback capacitors selectively coupled to the switched current source, each feedback capacitor to integrate the charging current provided by the switched current source, and a pair of switches, one switch coupled to each feedback capacitor, the switches to selectively couple the feedback capacitors to a pair of rotating capacitors.

The present invention provides a number of advantages. For example, use of a preferred embodiment of the present invention allows the sampling capacitor to be brought to a prespecified bias voltage while consuming only a small amount of power. This low power consumption increases battery life (or reduces the size of a power supply) and decreases heat dissipation concerns.

Also, use of a preferred embodiment of the present invention permits adjustments to be made to the amount of current used to bring the sampling capacitor to a prespecified bias voltage. For example, due to manufacturing (fabrication) variations, the actual value of the sampling capacitors may vary (sometimes significantly) from its nominal value. Therefore, a fixed current will place a bias voltage on the sampling capacitor that differs from the specified value. Use of a preferred embodiment of the present invention permits the charging current to be adjusted to place precisely the desired amount of bias voltage on the sampling capacitors.

Additionally, use of a preferred embodiment of the present invention reduces the overall noise injected into the system. The noise reduction is due to fact that each time a current is injected into the system, noise is also injected into the system. Since less current is injected into the system, less noise is injected into the system.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

The following discussion focuses on a particular type of radio receiver mixer and its circuitry that is operating in a 2.4 Gigahertz frequency band and is adherent to the Bluetooth technical standards. The Bluetooth technical standard specifies a short-range wireless communications network whose intended purpose is a low-power and low-cost replacement for physical cabling. The Bluetooth technical standard is specified in a document entitled "Specification of the Bluetooth System, Version 1.1, Feb. 22, 2001," which is incorporated herein by reference. While the discussion focuses on Bluetooth radios, the present invention is operable in other frequency bands and other technical standards, therefore, the discussion should not be construed as limiting the present invention to Bluetooth transceivers operating at 2.4 Gigahertz. For example, the present invention has application in low-earth orbit satellite system based communications systems and cellular based communications systems. The cellular based systems may include first, second, and third generation, time-division multiple access (TDMA), code-division multiple access (CDMA), global system for mobile communications (GSM) systems along with other digital communications systems operating at various carrier frequencies. Additionally, the receiver mixer of the present invention has application in wired receivers as well.

Figure 1A:
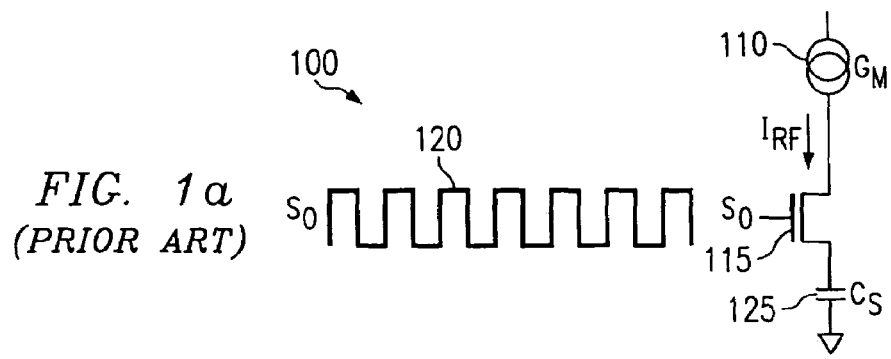
FIGS. 1a and 1b illustrate a prior art embodiments of current-mode sampling mixers.

Referring now to FIG. 1a, a block diagram illustrates a prior art embodiment of a current-mode direct sampling mixer 100. The mixer 100 includes an amplifier 110 (sometimes referred to as a low-noise transconductance amplifier (LNTA)), an RF switch 115 driven by a signal 120 generated by a local oscillator (not shown), and a sampling capacitor (Cs) 125. An alternative version of the mixer 100 exists wherein an antenna (not shown) is coupled to the amplifier, the antenna is used to receive analog RF signals transmitted over-the-air. The direct electrical coupling provides a direct signal path into the mixer 100.

An analog RF signal that is provided to the mixer 100 (the analog RF signal may be provided to the mixer 100 via a direct cable connection or transmitted over-the-air) in the form of an RF voltage that is then converted into an RF current by the LNTA 110, which has a transconductance gain of $g_m$. The flow of the RF current is switched by the RF switch 115, which is driven by the signal 120 generated by a local oscillator (LO). The frequency of the signal 120 is referred to as a sampling frequency and is commonly denoted $f_s$. The sampling frequency normally approximately equal to the frequency used to create the analog RF signal.

As displayed in FIG. 1a, when the signal 120 is high, the RF switch 115 is closed, creating a path for the RF current. The RF current is integrated by the sampling capacitor 125, increasing (or decreasing) the charge on the sampling capacitor 125, depending on the direction of the current flow. In order to fully sample the analog RF signal, an identical current-mode sampling mixer with an RF switch that is driven by an inverse (or complement) of the signal generated by the LO is used. The identical current-mode sampling mixer is used to sample the analog RF signal when the current-mode sampling mixer 100 is decoupled from the LNTA 110 by the RF switch 115 when the signal 120 is low.

Figure 1B:
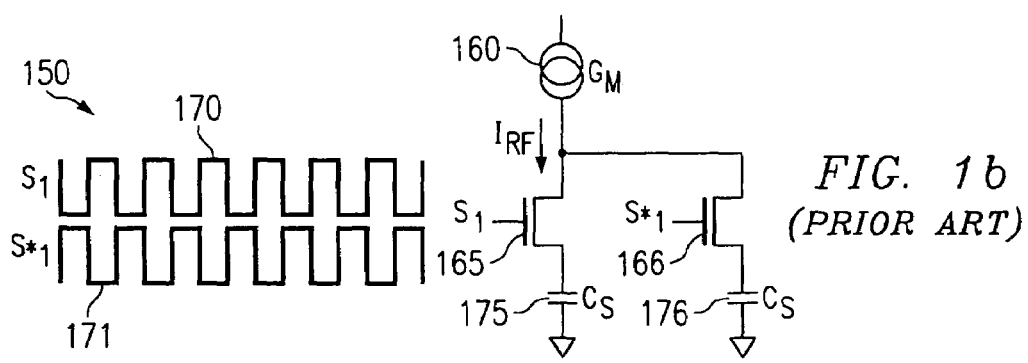

Referring now to FIG. 1b, a diagram illustrates a prior art embodiment of a current-mode direct sampling mixer 150 used to fully sample the analog RF signal. The mixer 150 is similar to the mixer 100 displayed in FIG. 1a with the addition of an extra RF switch and sampling capacitor. A first RF switch 165 is controlled by a signal 170, which is the same as the signal 120 in the mixer 100 displayed in FIG. 1a. However, a second RF switch 166 is controlled by a second signal 171 that may be thought of as an inverse (or complement) of the signal 170. The two signals 170 and 171 are operating on opposite half-cycles of one another. When one RF switch is on, the other RF switch is off. This configuration allows the mixer 150 to integrate the RF current at all times. The mixer 150, as illustrated in FIG. 1b, is operating in what is known as a pseudo-differential configuration.

Referring back to FIG. 1a, the charge that is integrated on the sampling capacitor 125 is periodically read out to produce a single sampled data value. The frequency of the charge read out can vary from being equal to the frequency of the signal 120 to some integer divisor of the frequency of the signal 120. The periodic reading of the charge on the sampling capacitor 125 produces a discrete-time sample stream of the analog RF signal.

Unfortunately, when the charge on the sampling capacitor 125 is being read out, the sampling capacitor 125 cannot be used to integrate the RF current, or vice versa. Therefore, the current-mode sampling mixer 100 as displayed in FIG. 1a does not permit the reading of the charge accumulated on its sampling capacitor 125 while the signal 120 is actively switching. Also, the amount of time required to read the charge from the sampling capacitor 125 is typically longer than the amount of time to integrate the RF current. Therefore, it is normally not feasible to attempt a charge read out while the signal 120 is inactive.

Figure 2:
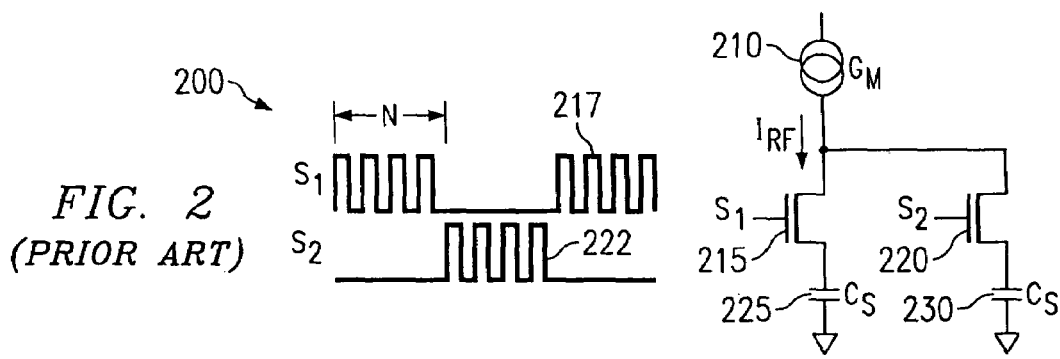
FIG. 2 illustrates a prior art embodiment of a current-mode sampling mixer with cyclic charge read off.

Referring now to FIG. 2, a block diagram illustrates a prior art embodiment of the current-mode sampling mixer 200 with cyclic charge read out. The mixer 200 is essentially the same as the mixer 150 of FIG. 1b. When more than one sampling capacitor is used, the current-mode sampling mixer is sometimes referred to as a multi-tap direct sampling mixer (MTDSM). A second RF switch 220 and sampling capacitor 230 pair allows the task of integrating the RF current to be shared between two sampling capacitors 225 and 230. The RF switches, S1 215 and S2 220, are driven by signals 217 (for switch S1) and 222 (for switch S2). The signals 217 and 222 may be thought of as portions of the signal generated by the LO. For example, the signal 217 may be configured to gate the signal produced by the LO for N cycles and then remain low for the next N cycles and return to gating the LO signal for the next N cycles. The number N is equal to the number of RF cycles the sampling capacitors will integrate the RF current. When the two signals 217 and 222 are combined, the result is the original signal produced by the LO.

When one signal (217 or 222) is gating the signal produced by the LO, the RF switch (215 or 220, respectively) that is controlled by the signal alternates between being closed and open, permitting the RF current to flow to the respective sampling capacitor. When one signal (217 or 222) is gating the signal produced by the LO, the other signal (222 or 217) is low, and the switch associated with the signal is open, not permitting any RF current to reach the sampling capacitor. While one sampling capacitor is busy integrating the RF current, the second sampling capacitor is not integrating the RF current and therefore its charge can be read out. The roles are then reversed to allow the reading of the charge integrated by the first sampling capacitor to be read out. If the capacitance of each of the sampling capacitors is $C_S$, then at any given time, the capacitance seen by the RF current remains $C_S$ because the RF current only sees one sampling capacitor at a time (due to the nature of the signals 217 and 222).

This periodic integration of a number of half-rectified RF samples performs a finite-impulse response (FIR) filtering operation and is sometimes referred to as a temporal moving average (MA). For example, if the number of half-rectified RF samples being integrated in each period is N, then the operation is referred to as a moving average N, or MA-N. The MA-N operation corresponds to an FIR filtering operation with N coefficients, with all coefficients being unity. The FIR filtering operation can be expressed in equation form as:

$$w_i = \sum_{l=0}^{N-1} u_{i-l}$$

Where: $u_i$ is the i-th RF sample and $w_i$ is the accumulated charge on the sampling capacitor. Due to the fact that the MA-N operation is being read out at the lower rate of once per N RF cycles, aliasing occurs with a foldover frequency at $f_0/2N$. FIR filtering and MA-N operations are considered well understood by those of ordinary skill in the art of the present invention and will not be discussed in detail in these specifications.

The current-mode sampling mixer can be further modified to perform an infinite-impulse response (IIR) filtering operation. IIR filtering operations are usually considered to be stronger filtering operations than FIR filtering operations. Therefore, IIR filtering operations are generally more preferred. IIR filtering operations are considered well understood by those of ordinary skill in the art of the present invention and will not be discussed in detail in these specifications.

Figure 3:
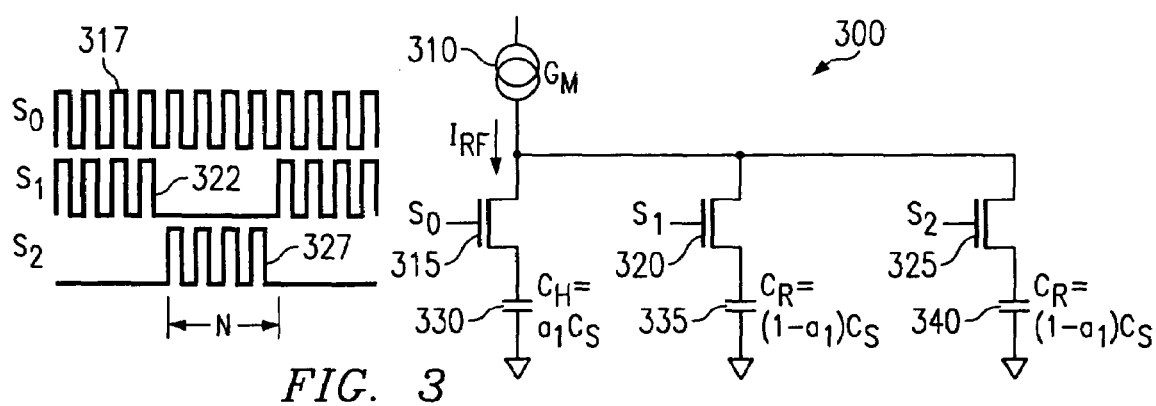
FIG. 3 illustrates a current-mode sampling mixer with recursive operation to provide infinite-impulse response filtering according to a preferred embodiment of the present invention.

Referring now to FIG. 3, a block diagram illustrates a current-mode sampling mixer 300 with recursive operation to provide IIR filtering according to a preferred embodiment of the present invention. According to a preferred embodiment of the present invention, the current-mode sampling mixer 300 uses two different types (in terms of capacitive value) of sampling capacitors. A first type of sampling capacitor is referred to as a history capacitor, denoted $C_H$, and is used to store the "history" of the RF current. According to a preferred embodiment of the present invention, the history capacitor always integrates the RF current, meaning that with exception of the negative half-cycle, the history capacitor continually integrates the RF current. A second type of sampling capacitor is referred to as a rotating capacitor, denoted $C_R$, and is used to periodically integrate the RF current in a manner similar to the sampling capacitors discussed in FIG. 2. Unlike the mixer 200 in FIG. 2, wherein the actual capacitive value of the sampling capacitors was not crucial as long as the sampling capacitors all had the same values, the values of the history and rotating capacitors in the mixer 300 is important. In actuality, the capacitive value of the sampling capacitors in FIG. 2 is used for determining the gain of the sampling operation, but is not vital to the proper operation of the mixer 200.

According to a preferred embodiment of the present invention, the value of the history capacitor is $a_1 * C_S$, where $C_S$ is the value of the sampling capacitor used in the mixer of FIG. 2 and $a_1$ is a constant. Given that the history capacitor has a specified value of $a_1 * C_S$, then it is preferred (for reasons that will be discussed below) that each of the rotating capacitors have a value of $(1-a_1)*C_S$. In a preferred embodiment of the present invention, the ratio of $C_H$ to $C_R$ is approximately 30. As an example, a preferred value for $a_1$ may be 0.9686. Therefore $C_H$ is approximately thirty one (31) times the value of each one of the $C_R$ capacitors, $C_H/C_R \cong 31$.

The mixer 300, as displayed in FIG. 3, has three RF switches 315, 320, and 325. The RF switches are driven by signals 317, 322, and 327 respectively. The signal 317 is the signal generated by the LO while signals 322 and 327 are gated versions of signal 317, similar to signals 217 and 222 from FIG. 2. Therefore, at any given instance in time, the RF current is being integrated by the history capacitor ($C_H$) and one of the two rotating capacitors ($C_R$). Since the capacitance of the history capacitor is $a_1 * C_S$ and that of the rotating capacitor is $(1-a_1)*C_S$, then the RF current sees an overall capacitance of $a_1 * C_S + (1-a_1)*C_S = C_S$. This is the same capacitance seen by the RF current in the mixer 200 displayed in FIG. 2.

Assuming that each rotating capacitor is active for N cycles, the IIR filtering is arrived at in the following manner: the RF current is integrated over N RF cycles, with the charge being shared on both the history and the active rotating capacitor. The amount of charge on the respective capacitors is proportional to their capacitance. At the end of an N cycle accumulation period, the active rotating capacitor stores $(1-a_1)$ of the total charge, stops further integration, and prepares for reading out its charge. The formerly inactive rotating capacitor joins the history capacitor in the integration process and at the same time obtains $(1-a_1)$ of the charge stored on the $C_H$ capacitor (assuming that the formerly inactive rotating capacitor had no initial charge). If the input charge integrated over the most recent N cycles is $w_j$, then the charge $s_j$ stored in the system at sampling time j can be described as a single-pole recursive IIR equation:

$$s_j = a_1 * s_{j-1} + w_j$$

and the output charge $x_j$ is $(1-a_1)$ times the system charge of the most recent cycle. This is a discrete-time IIR filter operating at $f_0/N$ sampling rate and possesses a single pole, where $f_0$ is the frequency of the signal generated by the LO.

When operating at high frequencies, for example, if the wireless transceiver is designed for use as Bluetooth transceiver, the operating frequency ($f_0$) is 2.4 Gigahertz and if N=8, then the read out frequency is $f_0/N$ or 300 MHz. Although significantly smaller than 2.4 GHz, 300 MHz remains a very high frequency when it comes to reading out the charge on the rotating capacitors, therefore, it is desired to relax the read out time even more. One way that the period of the read out time may be further increased is by adding additional rotating capacitors, $C_R$, and then reading the charge stored on one of the rotating capacitors while the remaining capacitors continue integrating the RF current.

Figure 4:
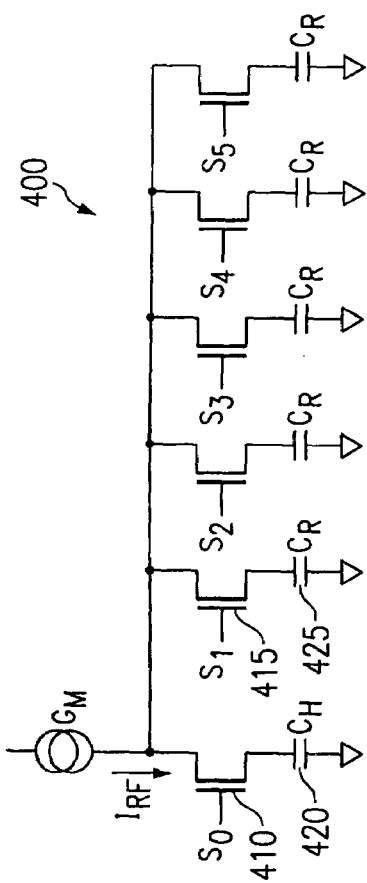
FIG. 4 illustrates the use of rotating capacitors in a current-mode sampling mixer to increase (relax) the charge read off time according to a preferred embodiment of the present invention.

Referring now to FIG. 4, a block diagram illustrates the use of five rotating capacitors in a current-mode sampling mixer 400 to increase the charge read out time according to a preferred embodiment of the present invention. The mixer 400 is identical to the mixer displayed in FIG. 3, with the exception of three additional rotating capacitors and RF switches. The mixer 400 has a redundancy of 4 (the total number of rotating capacitors minus one: (5−1=4)). The RF switches for the rotating capacitors (RF switches S1, S2, S3, S4, and S5) are driven by signals designed so that only one of the RF switches is active at a given time. An RF switch 410, S0, controls the history capacitor and is driven by a signal generated by the LO, making it active at all times when the signal generated by the LO is high.

One of the five rotating capacitors is chosen to have its charge read out. The charge read out cycle may be as long in duration as the integration time of the four remaining rotating capacitors, hence providing a larger amount of time (when compared to the integration time of a single rotating capacitor) to extract the charge stored on the selected rotating capacitor.

According to a preferred embodiment of the present invention, the charge collected on the rotating capacitors that are not selected for charge read out is discarded by short-circuiting them (to electrical ground) when they are not in use. The discarding of the charge on the unselected rotating capacitors results in what is known as decimation, a reduction in the total number of samples used to represent a signal. In the example displayed in FIG. 4, there are five rotating capacitors and only one rotating capacitor is read out, therefore, the decimation is equal to five since only one out of every five samples is used and the remaining four samples are discarded. Decimation is known to cause aliasing and compensation for the aliasing must be provided. Aliasing is a phenomenon that occurs when frequency components of a signal that are located at frequencies greater than the sampling frequency are wrapped around and added to frequency components that are less than the sampling frequency. Aliasing is considered well understood by those of ordinary skill in the art of the present invention and will not be discussed in detail in these specifications.

Additional banks of rotating capacitors can be added to the mixer as an alternative to simply adding rotating capacitors to reduce timing constraints on the charge read out. By simply adding rotating capacitors to an existing current-mode sampling mixer, as displayed in FIG. 4, the samples are decimated by an increasingly larger amount. When there are M rotating capacitors and there are no capacitor banks, the decimation of the discrete-time sample stream is equal to M. The greater the decimation of the sample stream, the greater the amount of aliasing that occurs. Therefore, it is preferred to minimize undesired decimation of the sample stream.

Figure 5:
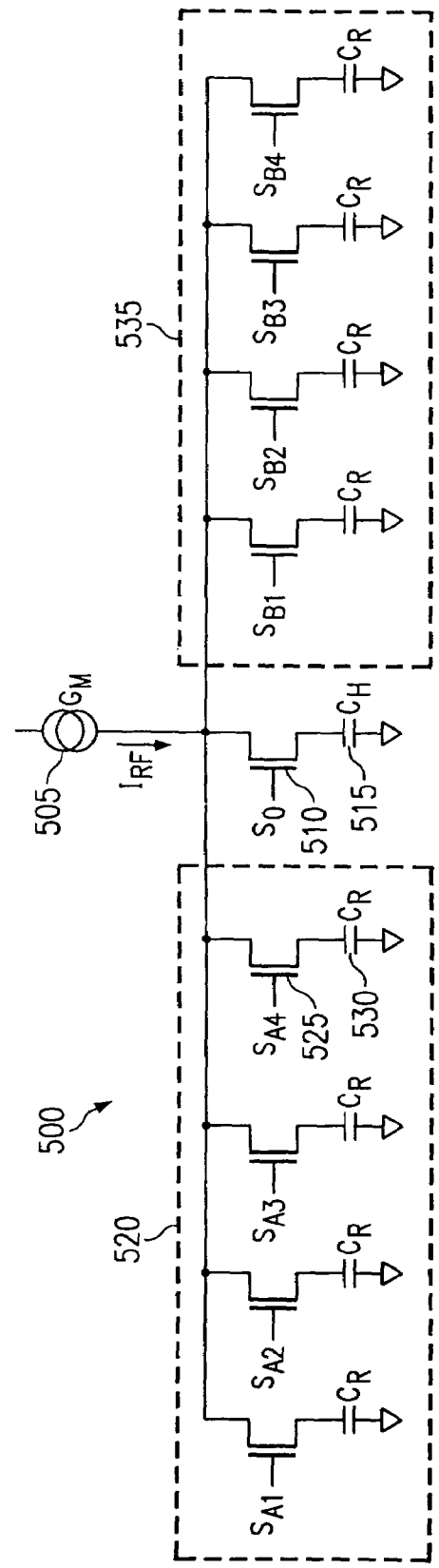
FIG. 5 illustrates the use of two banks of rotating capacitors in a current-mode sampling mixer to simultaneously reduce the aliasing of the digital sample stream and relax the charge read off time according to a preferred embodiment of the present invention.

Referring now to FIG. 5, a block diagram illustrates a current-mode sampling mixer 500 utilizing two banks of rotating capacitors 520 and 535 to simultaneously reduce the aliasing of the discrete-time sample stream and relax the charge read out time according to a preferred embodiment of the present invention. The mixer 500 has an RF switch 510, S0, and a history capacitor 515 like the mixer displayed in FIG. 4. According to a preferred embodiment of the present invention, at any given time, one of the rotating capacitor banks 520 or 535 is integrating the RF current with one of its rotating capacitors, for example, rotating capacitor 530, while the remaining rotating capacitors are waiting their turn at integrating the RF current. While one rotating capacitor bank is busy integrating the RF current, the other rotating capacitor bank is having the charge on its rotating capacitors simultaneously read out.

Figure 6A:
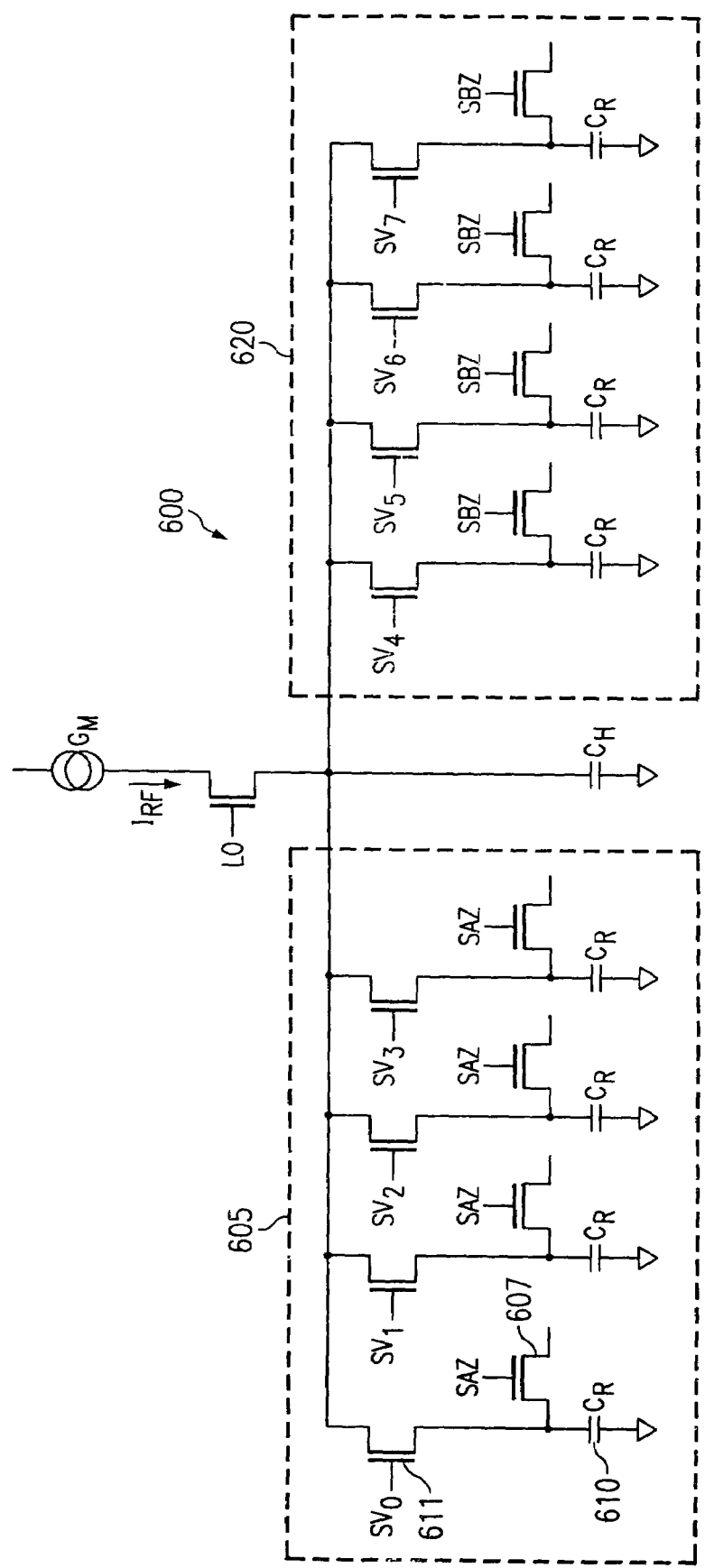
FIGS. 6a and 6b illustrate two different current-mode sampling mixers, each with two banks of rotating capacitors with separate RF switches according to a preferred embodiment of the present invention.

Referring now to FIG. 6a, a block diagram illustrates a current-mode sampling mixer 600 with two banks of rotating capacitors 605 and 620 and a separate RF switch according to a preferred embodiment of the present invention. Each rotating capacitor, for example, rotating capacitor 610, is flanked by a switch 607, which is controlled by a charge read out signal. When the charge read out signal is active, the charge on the rotating capacitor can be read through the switch 607. Flanking the charge read out switch is another switch 611. This switch 611 is controlled by a signal that activates and deactivates the rotating capacitor for integrating of the RF current.

Figure 6B:
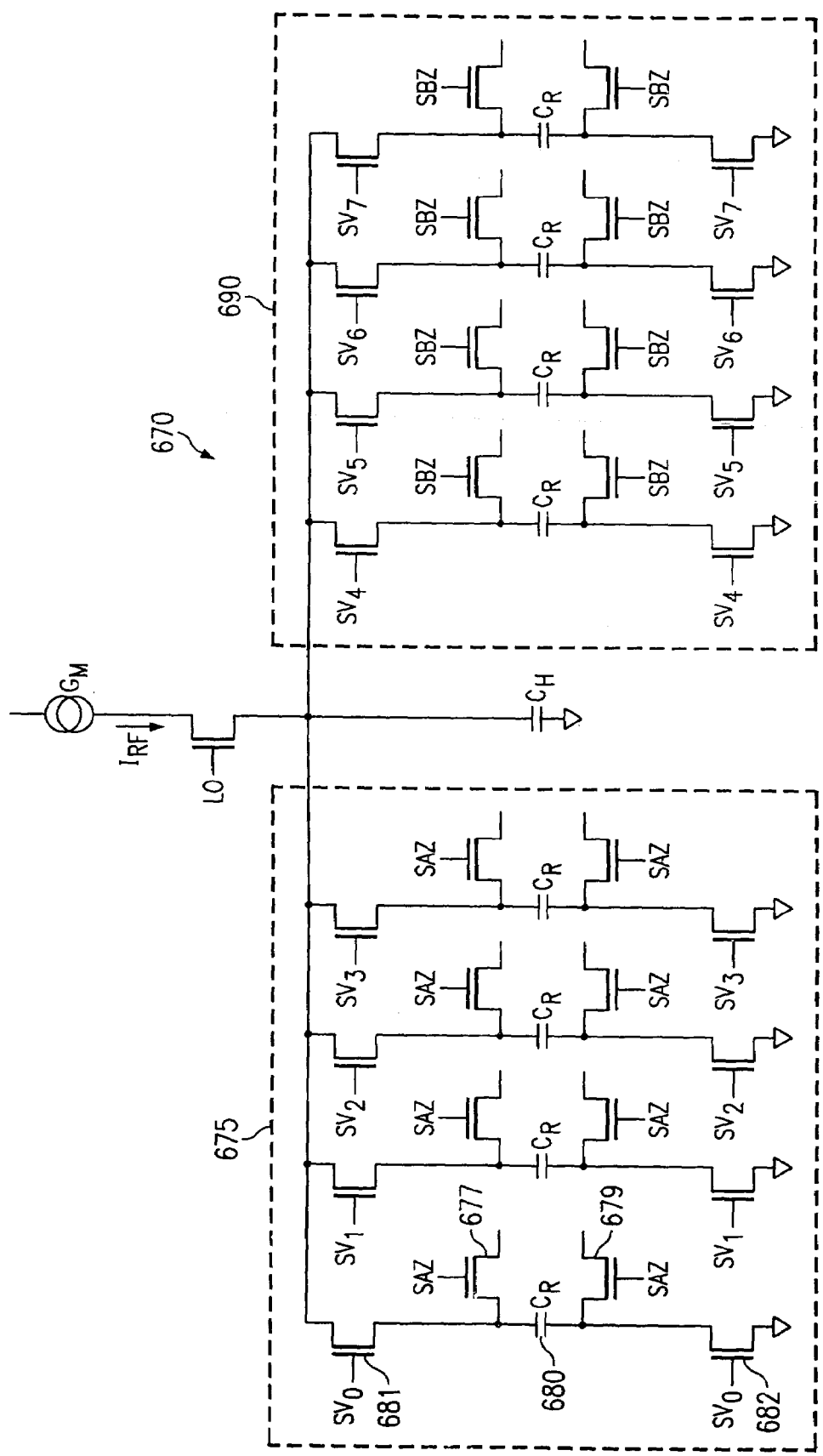

Referring now to FIG. 6b, a block diagram illustrates a current-mode sampling mixer 670 with two banks of rotating capacitors 675 and 690 and a separate RF switch according to a preferred embodiment of the present invention. The mixer 670 is essentially the same as the mixer 600 displayed in FIG. 6a, with the exception that a rotating capacitor, for example, rotating capacitor 680, is flanked by two switches 677 and 679 that are used to control the charge read out and a two other switches 681 and 682 control the integration of the RF current by the rotating capacitor. A useful feature of this particular embodiment is that the charge read out can occur without requiring a coupling to electrical ground. This may be advantageous is a situation such as when the read out charge is coupled to a feedback path of an operational amplifier.

Figure 7:
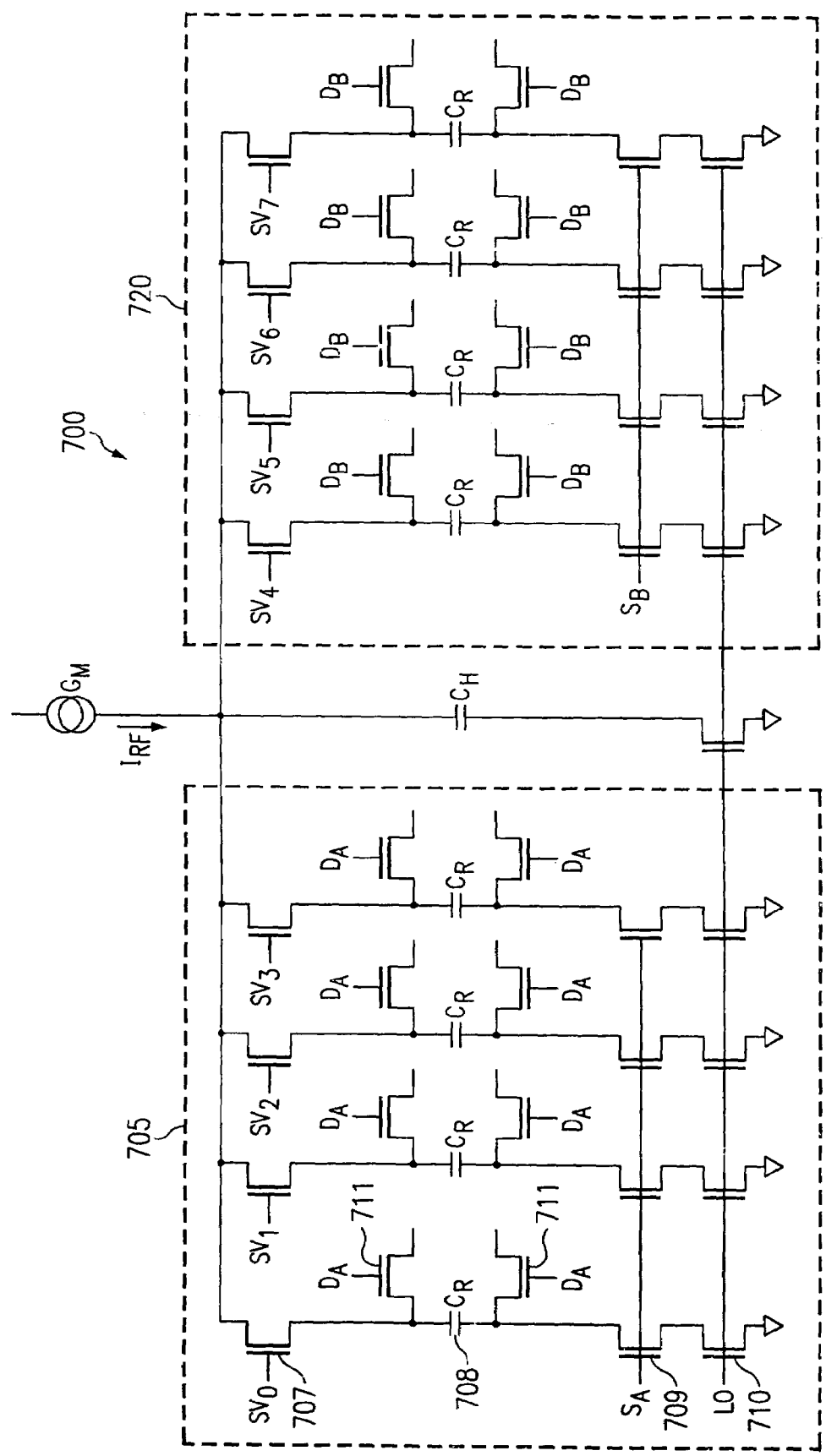
FIG. 7 illustrates a current-mode sampling mixer with two banks of rotating capacitors arranged to make use of the bottom-plate sampling technique according to a preferred embodiment of the present invention.

Referring now to FIG. 7, a block diagram illustrates a current-mode sampling mixer 700 with two banks of rotating capacitors 705 and 720 arranged to make use of a bottom-plate sampling technique according to a preferred embodiment of the present invention. The bottom-plate sampling technique is a widely known and used technique in the field of switched capacitor circuits. The use of bottom plate switching offers an advantage in reducing the injection of switching noise into the system. Each rotating capacitor, for example, capacitor 708, is coupled to electrical ground by a pair of switches. A first switch 709 is controlled by a sampling control signal and a first RF switch 710 is controlled by a signal generated by the LO. According to a preferred embodiment of the present invention, when both the sampling signal and the LO signal are high, then the rotating capacitor 708 may integrate the RF current if its sampling control signal is also active. A second switch 707 is controlled by the sampling control signal. An additional switch pair (displayed as two switches labeled 711) is used to permit the charge read out.

Due to differences between the impedance of the mixer and desired output impedance, an active buffer is required to isolate the mixer from the output. Typically, the mixer has a high impedance while it is desired that the output have a low driving impedance. The active buffer can also be used to realize a second, lower-rate IIR filtering operation through the use of passive charge sharing.

Figure 8:
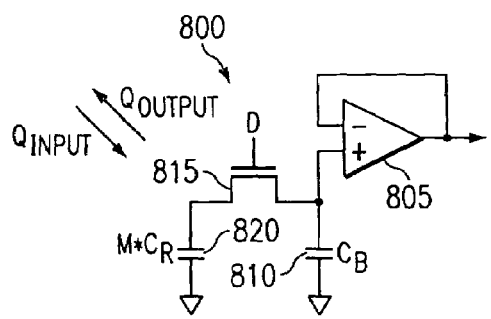
FIG. 8 illustrates an active buffer used to realize a second infinite-impulse response filter stage according to a preferred embodiment of the present invention.

Referring now to FIG. 8, a diagram illustrates the use of an active buffer 805 to realize a second IIR filtering stage 800 according to a preferred embodiment of the present invention. The buffer 805 actually does not play an active role in the IIR filtering operation. Rather, it is used to sense voltage from a buffer capacitor 810, $C_B$, and to present it to the output with a low driving impedance. FIG. 8 uses a single rotating capacitor 820 to represent an entire bank of rotating capacitors (discussed previously). Note that a reference made to the rotating capacitor 820 is actually a reference to an entire bank of rotating capacitors. The rotating capacitor 820 has a capacitance of $M*C_R$. An RF switch 815 couples the rotating capacitor 820 to the buffer capacitor 810 during the charge read out phase. As discussed previously, M is the number of rotating capacitors in a single capacitor bank, and in this example, M=4. At the end of the charge read out phase, the switch 815 opens, disconnecting the rotating capacitor 820 from the buffer capacitor 810. After being disconnected, the rotating capacitor 820 has its charge reset. It is the resetting of the charge stored on the rotating capacitors that gives rise to the IIR filtering operation. According to a preferred embodiment of the present invention, the IIR filtering operation is referred to as an IIR-2 filtering operation.

Figure 9:
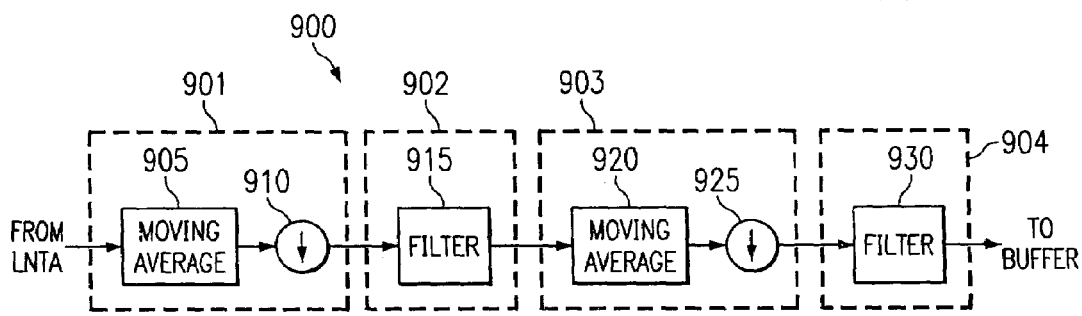
FIG. 9 illustrates the signal processing performed by a current-mode sampling mixer according to a preferred embodiment of the present invention.

Referring now to FIG. 9, a block diagram illustrates a current-mode sampling mixer 900 grouped by the signal processing steps that it performs according to a preferred embodiment of the present invention. According to a preferred embodiment of the present invention, the signal processing performed by the mixer can be logically viewed as four distinct FIR/IIR filtering operations. A first FIR filtering operation 901 arising from a combination of a moving average operation 905 and a decimation operation 910 resulting from the configuration of the rotating capacitors (such as one displayed in FIG. 5). The moving average and decimation operations are the result of the integrating of N consecutive cycles of the RF current by a single rotating capacitor. A second filtering operation 902 is an IIR filtering operation (displayed in FIG. 9 as a filter 915) and referred to as an IIR-1 operation. The IIR-1 filtering operation arises from the presence of the history capacitor and the continuous integration of the RF current by the history capacitor and its use in conjunction with the rotating capacitors. The filtering operation 915 is determined by the ratio of the history capacitor, $C_H$, to the value of the rotating capacitors, $C_R$. The IIR-1 filtering operation has a pole at $1/(1-a_1)$, where $a_1$ is a number smaller than 1.

A third filtering operation 903 is a second FIR filtering operation that is a combination of a second moving average operation 920 and a second decimation operation 925. These two operations result from the configuration and arrangement of the rotating and buffer capacitors (such as displayed in FIG. 8). The second moving average and decimation operations 920 and 925 are directly dependent of the number of rotating capacitors in a rotating capacitor bank. According to a preferred embodiment of the present invention, the number of capacitors in a rotating capacitor bank is four. Therefore, the moving average operation 920 is a moving average of four and the decimation operation 925 is a decimation by four. Finally, a fourth filtering operation 904, an IIR filtering operation referred to as an IIR-2 operation, also arises from the configuration of the rotating and buffer capacitors. The IIR-2 operation is achieved at the end of the charge dump phase, when the rotating capacitor 820 is disconnected from the buffer capacitor 810 and any remaining charge on the rotating capacitor 820 is reset prior to returning to actively integrating the RF current. It is the resetting of the charge that gives rise to the IIR-2 operation. The filtering operation 930 has a pole at $1/(1-a_2)$, where $a_2$ is defined as $C_B/(C_B+M*C_R)$, where $C_B$ is the value of the buffer capacitor (810, FIG. 8) and $M*C_R$ is the number of capacitors in a rotating capacitor bank (M) multiplied by the value of a rotating capacitor ($C_R$). The behavior is expressible in equation form:

$$z_k = a_2(z_{k-1} + y_k) = a_2 z_{k-1} + a_2 y_k$$

where: $y_k$ is the input charge, $z_k$ is the charge stored on the buffer capacitor $C_B$ 810 at sampling time k.

As discussed previously, a bias voltage may be developed onto the rotating capacitors after the rotating capacitors have had their accumulated charges read out and reset. For example, the bias voltage on the rotating capacitors may be set to a specified value to prevent accumulated charge on the history capacitor from exceeding a maximum (or minimum) amount of charge that the capacitor can hold. Because the history capacitor is continually integrating the RF current, the maximum (or minimum) amount of charge that the history capacitor can hold is of vital concern. If care is not taken, more (or less) charge can be placed onto the history capacitor than it can hold and the information represented by the charge is lost. Due to its periodic charge dumping and subsequent resetting (preferably, once every N RF cycles), the charge integrated by the rotating capacitors exceeding the rotating capacitor's maximum (or minimum) is not of as great a concern. One way to accomplish the setting of a bias voltage onto the rotating capacitors is through the use of a feedback correction loop, wherein a feedback current is integrated by a feedback capacitor, which in turn shares its charge with the rotating capacitors.

The RF current that is being integrated by a sampling capacitor may, depending on orientation, increase or decrease the charge stored on the sampling capacitor. Note that the term sampling capacitor may represent a combination of the history capacitor and an active rotating capacitor. It should be noted that the RF current when averaged over an extended period of time, has zero mean. This implies that approximately half of the time, the RF current has a positive orientation and the other half of the time, the RF current has a negative orientation. This also implies that after integrating the RF current for an extended amount of time, the charge on the sampling capacitor is at a same level as when the integration period began. Therefore, if the sampling capacitor has no initial charge and if only a positive power supply were present, then, when the RF current is negative and there is not sufficient charge already on the sampling capacitor, information from the RF current will be lost because the sampling capacitor is not capable of storing a negative charge. The reduction of the number and types of power supplies on an integrated circuit results in lower device costs and less power consumption, therefore it is highly desirable to use as few power supplies as possible.

If a prespecified bias voltage were to be developed onto the sampling capacitor, then the sampling capacitor would be able to integrate the negative RF current, with the charge on the sampling capacitor decreasing each time a negative RF current was integrated. Correspondingly, each time a positive RF current was integrated, the charge on the sampling capacitor would increase. Given the zero mean nature of the RF current, the overall charge on the sampling capacitor would remain constant in the long run. It is common to place a bias voltage on the sampling capacitor that corresponds to a voltage drop across the capacitor that is equal to approximately one-half the value of the voltage supply. For example, if the voltage supply used was a 1.5-volt supply, then it is preferred to set the bias voltage on the sampling capacitor to 0.75-volts.

However, a large voltage bias implies a large amount of power consumed and greater nonlinearities due to lower gate-source voltage, Vgs. The amount of power consumed is proportional to the square of the voltage; therefore it is optimal to minimize the voltage bias, wherein the voltage bias remains sufficient to support the integration of the negative RF current, but not unnecessarily high such that power is expended unnecessarily. According to a preferred embodiment of the present invention, a preferred bias voltage on the rotating capacitor is approximately 450 millivolts (0.45 volts) for a current-mode sampling mixer with a 1.5-volt power supply.

As discussed previously, the rotating capacitors ($C_R$) may be initialized to a specified bias voltage value after the rotating capacitors have had their accumulated charges read off and reset. This bias voltage is then charge shared with the history capacitor to set the bias voltage on the history capacitor to a desired value. For example, the bias voltage on the history capacitor may be set to a specified value to prevent newly accumulated charge from increasing (or decreasing) the charge on the history capacitor to a level that is greater (or less) than what the capacitor can hold. An added benefit of placing a bias voltage on the rotating capacitor is to prevent the rotating capacitor from saturating (or depleting) as well, although this is an unlikely even due to the regular resetting of the charge on the rotating capacitors. One way to accomplish the placing of a specified bias voltage onto the rotating capacitors is through the use of a feedback correction loop, wherein a feedback current is integrated by a feedback capacitor, which in turn shares its charge with the rotating capacitors resulting in a bias voltage being developed onto the history capacitors.

Figure 10A:
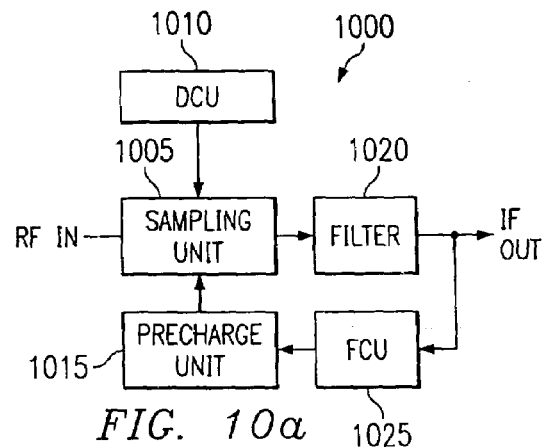
FIGS. 10a and 10b illustrate both a high-level view and a detailed view of a feedback charge accumulation structure used to initialize a charge on the rotating capacitors according to a preferred embodiment of the present invention.

Referring now to FIG. 10a, a block diagram illustrates a high-level view of a portion of a current-mode sampling mixer 1000 with a feedback correction loop used to set a prespecified voltage on the history capacitor according to a preferred embodiment of the present invention. FIG. 10a displays the portions of the mixer 1000 involved with the feedback correction loop and the integration of the RF current, other portions of the mixer 1000 are not displayed. The mixer 1000 includes: a sampling unit 1005, which is used to integrate the RF current using history and rotating capacitors (sometimes referred to collectively as sampling capacitors), a digital control unit (DCU) 1010 used to, among other things, provide timing signal for activation and deactivation of the rotating capacitors located within the sampling unit 1005, a precharge unit 1015 used to place a prespecified charge on the rotating capacitors, a filter 1020 with analog-to-digital (ADC) conversion and possible FIR filtering used to attenuate noise from the discrete-time sample stream provided by the rotating capacitors, and a feedback control unit (FCU) 1025 used for, among other things, controlling the amount of charge (bias voltage) being placed on the rotating capacitors. The output of the filter 1020 is sent to a digital signal processing unit (not shown), where the output receives further processing to produce data that is usable by the user. For example, the digital signal processing unit may be used to decode received data that had been encoded for transmission purposes, it may provide additional noise filtering, and/or it may provide error detection and correction, etc.

The FCU 1025 determines the amount of bias voltage that it places on the rotating capacitors by examining the discrete-time sample stream at the output of the filter 1020. According to a preferred embodiment of the present invention, by averaging the outputs of the filter 1020 over a period of time, the FCU 1025 can determine the amount of bias voltage that it needs to place on the rotating capacitors. By averaging the outputs of the filter 1020, the FCU 1025 measures a direct current (DC) offset of the outputs. The FCU 1025 then can compare the measured DC offset with a desired DC offset and calculate any needed change to the bias voltage it is applying on the rotating capacitors and indirectly, the history capacitor. For example, if the measured DC offset is lower than the desired DC offset, the FCU 1025 can raise the bias voltage on the rotating capacitors.

The FCU 1025, through control signaling, causes a bias voltage to be developed onto a feedback capacitor (not shown) located in the precharge unit 1015. According to a preferred embodiment of the present invention, the control signals from the FCU 1025 are directed to a current-mode digital-to-analog converter (DAC) (not shown) in the precharge unit 1015. Alternatively, the signals from the FCU 1025 can be used to control the operation of a switchable current source. The switchable current source to produce a current at a specified amount when receiving an appropriate command from the FCU 1025. The current from the DAC is used to develop the bias voltage onto the feedback capacitor. The bias voltage is developed onto the feedback capacitor through the integration of the current from the DAC by the feedback capacitor. The actual mechanism is similar to the rotating capacitors integrating the RF current, although the feedback capacitor is not switched as frequently as the rotating capacitors.

Figure 10B:
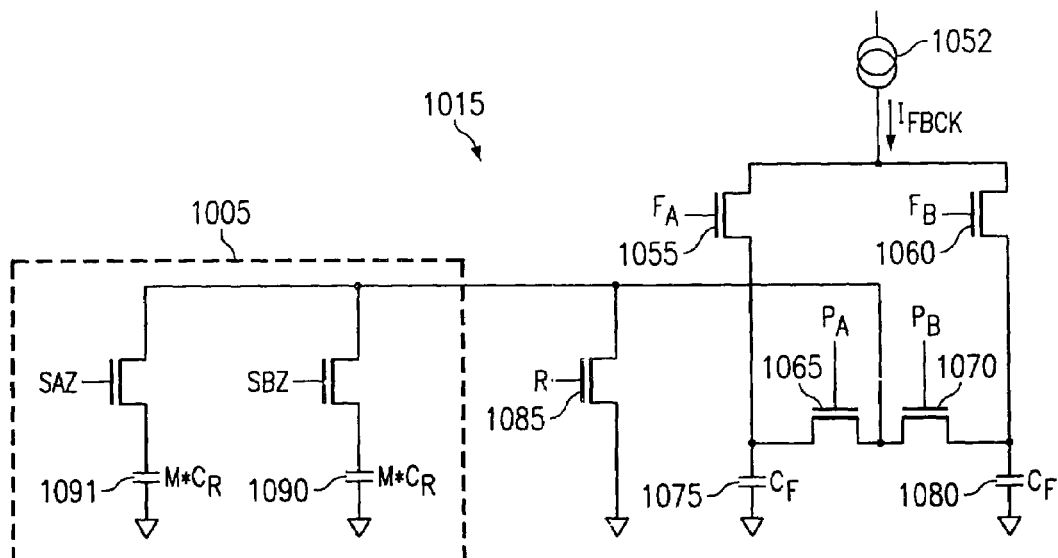

Referring now to FIG. 10b, a block diagram illustrates a detailed view of the precharge unit 1015 used to develop a bias voltage onto the rotating capacitors 1090 and 1091 according to a preferred embodiment of the present invention. The precharge unit 1015 as displayed in FIG. 10b is used to precharge the rotating capacitors for a signal path in the current-mode sampling mixer.

A current source 1052, such as a current-mode DAC as described previously, receives control signals from the FCU 1025 and provides a current of specified magnitude ($i_{fbck}$). The FCU 1025 may issue commands to specify the duration of the current. Alternatively, the FCU 1025 determines the needed amount of current that the current source 1052 is to provide and simply controls the duration of the current provided by the current source 1052 by switching the current source 1052 on and then off for the desired duration. As configured, only one of two switches 1055 and 1060 is closed at a given time. The switches 1055 and 1060 are controlled by signals generated by the DCU 1010. According to a preferred embodiment of the present invention, the signals generated by the DCU 1010 are such that only one switch (either 1055 or 1060) is closed at a given time, permitting the current to flow to one feedback capacitor. When one of the switches (1055 or 1060) is closed, current from the current source 1052 is available to charge a feedback capacitor, $C_F$. For example, assuming that switch 1055 is closed, the current can flow through the switch and be accumulated by a feedback capacitor 1075. Should switch 1060 be closed, the current would then be accumulated by a feedback capacitor 1080.

A switch 1065 or 1070 controls the coupling of the feedback capacitor 1075 or 1080 to the rotating capacitors 1090 or 1091. Once again, the switch 1065 or 1070 is controlled by signals generated by the DCU 1010. According to a preferred embodiment of the present invention, one switch (either 1065 or 1070) is closed at a time, permitting the charge accumulated on the feedback capacitor to be shared with the rotating capacitors and then the history capacitor.

Another switch 1085 is used to reset (remove) any residual charge on the rotating capacitors after the rotating capacitors have had their charge read out and prior to sharing the charge of the feedback capacitor. Controlled by a signal generated by the DCU 1010, the switch couples one bank of rotating capacitors to electrical ground, removing any charge on the capacitors.

The accumulation of the charging current $i_{fbck}$ for a time duration T on the feedback capacitor $C_F$ yields an incremental accumulation of charge: $\Delta Q_{in} = i_{fbck} * T$. This charge is added to the total charge on the feedback capacitor at a discrete time instance, k, as:

$$Q_F(k) = Q_F(k-1) + \Delta Q_{in} = Q_F(k-1) + i_{fbck} * T \quad (1)$$

When the charge of the feedback capacitor is shared with the rotating capacitor bank with a collective capacitance of $M*C_R$, the charge depleted from the feedback capacitor is dependent on the relative capacitor values and can be expressed as:

$$\Delta Q_{out}(k) = \frac{MC_R}{C_F + MC_R} * Q(k) \quad (2)$$

According to a preferred embodiment of the present invention, a constant charging current is used to charge the feedback capacitor. Because of this, the charge on the feedback capacitor will continue to accumulate until the net charge intake becomes zero, e.g., $Q_{in}=Q_{out}$. Equilibrium is reached when $\Delta Q_{in}(k)=\Delta Q_{out}(k)$. Using the above expressions, the equilibrium condition for a discrete time instance, k, may be expressed as:

$$i_{fbck} * T = \frac{MC_R}{C + MC_R} * Q_F(k) \quad (3)$$

The above expression can be transformed to provide the equilibrium voltage (using the basic voltage and charge relationship $V_F = Q_F/C_F$):

$$V_{F,eq} = i_{fbck} * T * \frac{C_F + MC_R}{C_F * MC_R} \quad (4)$$

The $\Delta Q_{out,eq}$ charge transfer into the rotating capacitor bank at equilibrium will result in a voltage on the capacitor bank equal to $$V_R = \frac{i_{fbck} * T}{MC_R}.$$

The bias voltage then developed onto the history capacitor is equal to $$V_H = \frac{i_{fbck} * T}{MC_R},$$

since the voltage transfer function between the rotating capacitor bank and the history capacitor is unity. Therefore, since $MC_R$ and $i_{fbck}$ are known, it is possible to calculate a time T for a desired $V_H$ value.

Figure 11A:
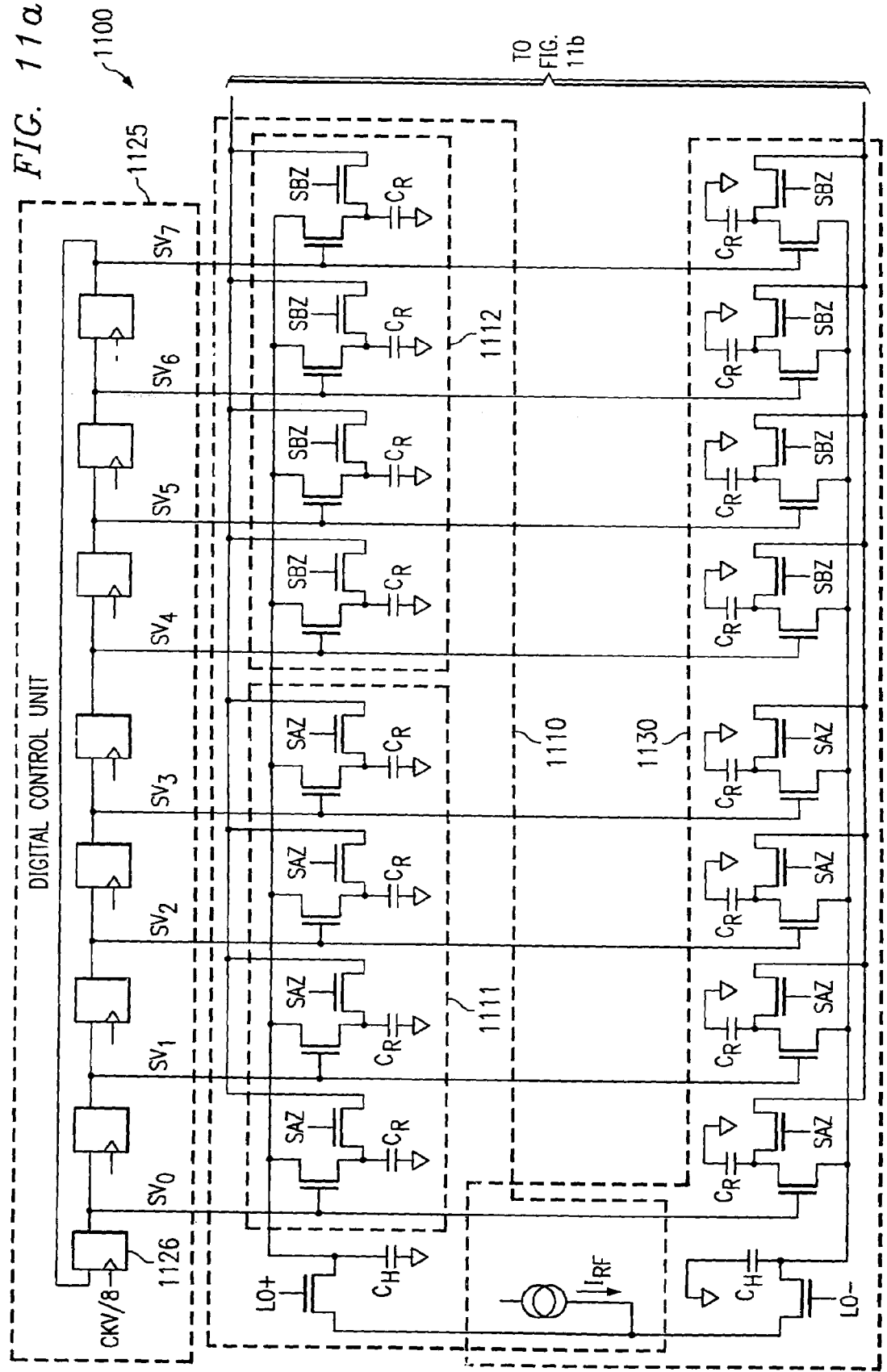
FIGS. 11a, 11b and 11c illustrate a physical implementation of a current-mode sampling mixer and the timing of signals in the mixer according to a preferred embodiment of the present invention.
Figure 11B:
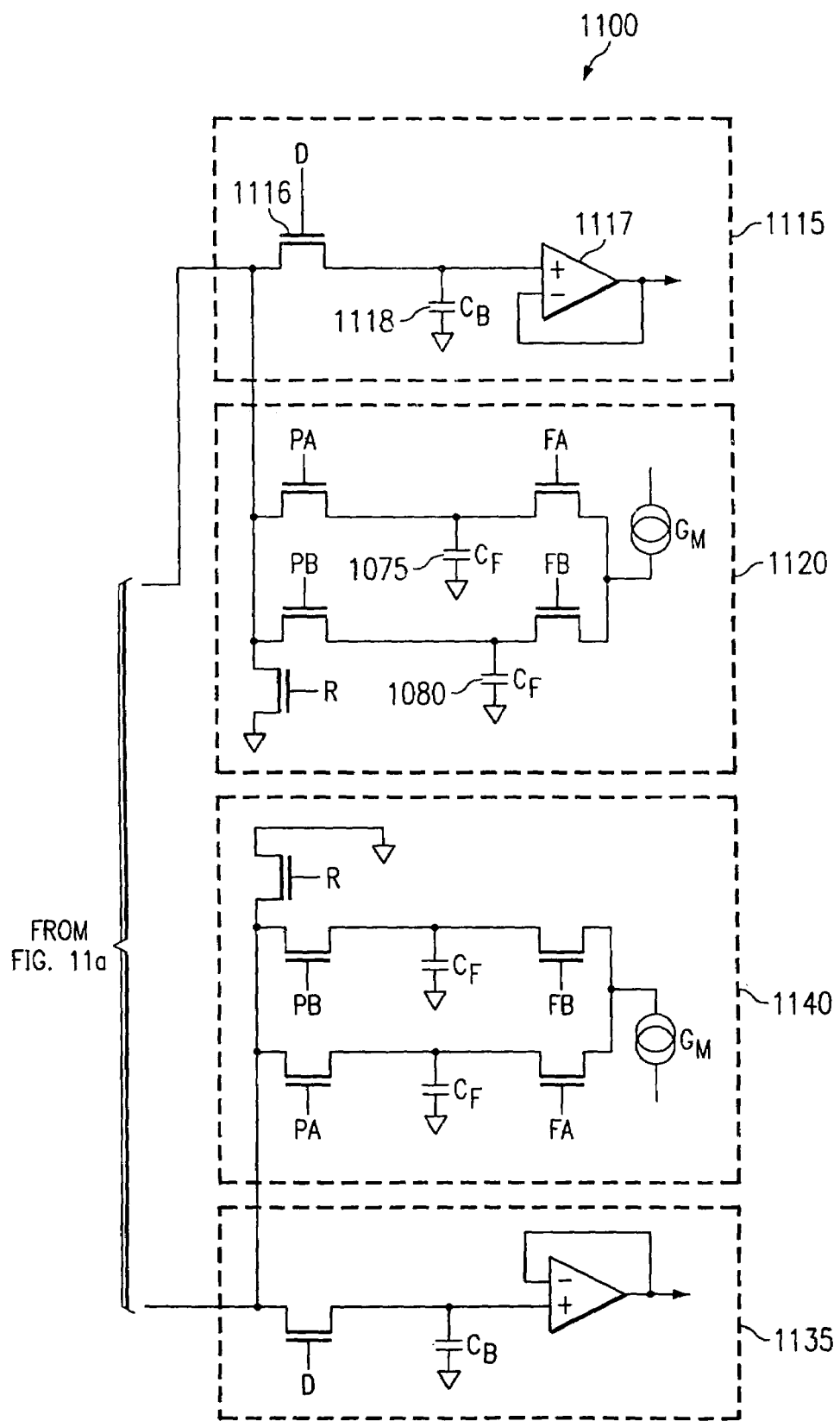

Referring now to FIG. 11a, a block diagram illustrates a detailed view of a portion of a current-mode sampling mixer 1100 with circuitry to allow the precharging of rotating capacitors to a prespecified bias voltage according to a preferred embodiment of the present invention. A sampling unit 1110 includes a pair of rotating capacitor banks 1111 and 1112 is used to integrate RF current. The use of the multiple rotating capacitor banks to allow sufficient time for charge read out was discussed previously. Coupled to the sampling unit 1110 is a precharge unit 1120. The precharge unit 1120 is used to reset the charge stored on the rotating capacitor banks 1111 and 1112, and set the bias voltage on the rotating capacitors in a selected rotating capacitor bank. The function of the precharge unit 1120 was discussed earlier in conjunction with FIG. 10b.

A dump unit 1115 with output buffer, also attached to the sampling unit 1110, permits the charge accumulated on the rotating capacitors in a rotating capacitor bank to be dumped (read out). When a switch 1116 is closed, the inactive capacitor bank is coupled to an output buffer 1117 and a buffer capacitor 1118. The function of the dump unit 1115 with output buffer was discussed earlier in conjunction with FIG. 8. A similar set of circuitry provides the sampling, reset, precharge, and dumping functionality for a second signal path.

Figure 11C:
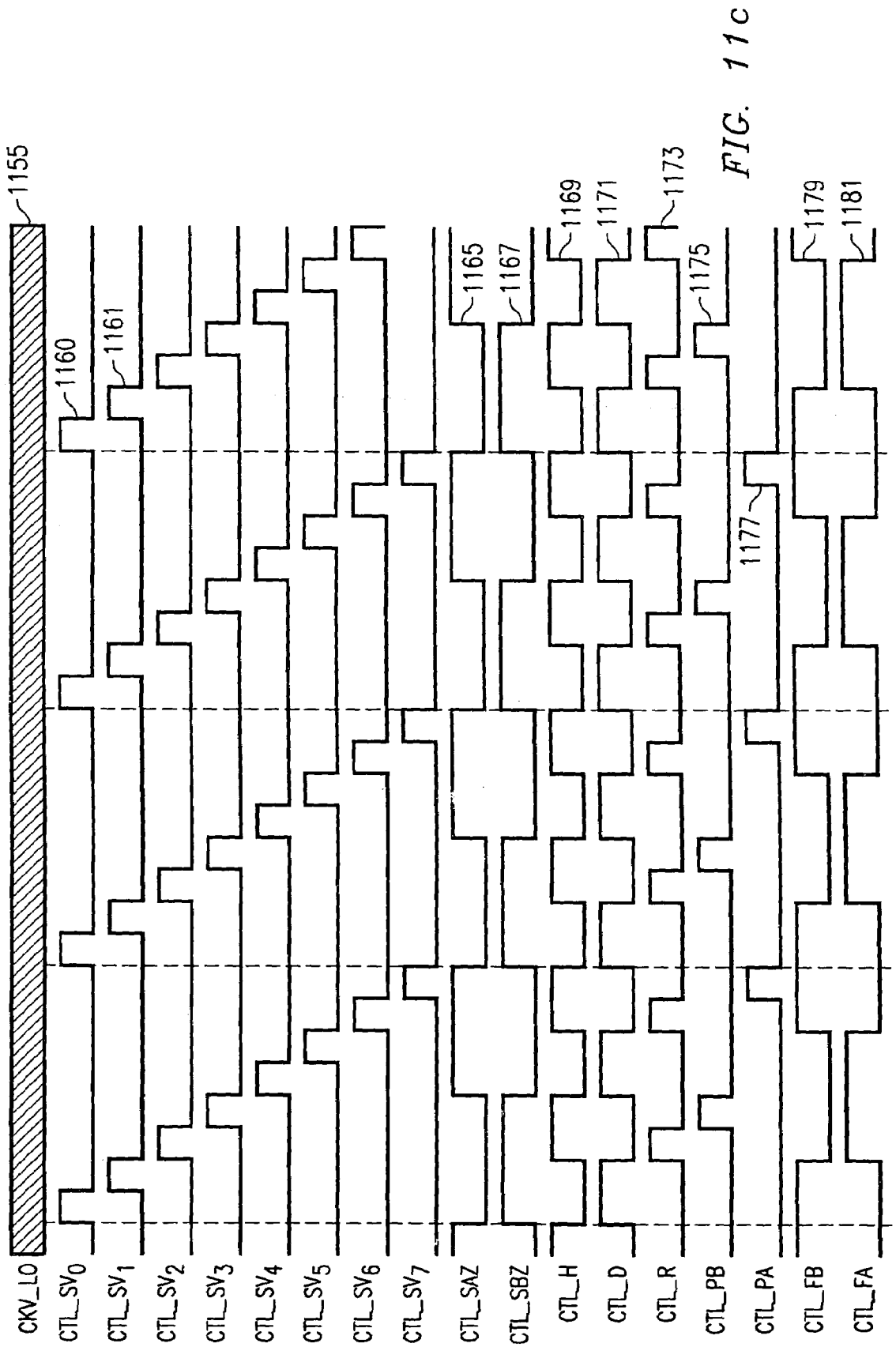

Referring now to FIG. 11c, a timing diagram illustrates the relationship between various signals used in the mixer 1100 according to a preferred embodiment of the present invention. A first timing trace 1155 displays a signal generated by a LO. Note that the frequency of the signal is so great that the timing trace 1155 appears to be a solid line. A second timing trace 1160 displays the signal "$SV_0$" used to control a rotating capacitor, for example, a rotating capacitor in capacitor bank 1111 in FIG. 11a. The signal "$SV_0$" is also used to control a rotating capacitor in the other signal path displayed in FIG. 11a as well as other two signal paths (not shown). Other timing traces display the other SV signals for controlling the other rotating capacitors. Notice a pulse on a third tuning trace 1161 displaying the signal "$SV_1$" begins a small amount of time after the pulse on the second timing trace 1160 ends. Note that due to display limitations, FIG. 11c displays the traces as if one trace begins immediately after another trace ends when there is actually a small amount of time between the end of one pulse and the beginning of another. The delay between pulses on the timing traces is due to a non-overlap circuit (not shown). The non-overlap circuit ensures that a small finite period of time exists between activating pulses in rotating capacitor control signals.

A fourth timing trace 1165 displays the "SAZ" signal. The SAZ signal is used to deactivate the rotating capacitor bank A. When the SAZ signal is high, the charge on the rotating capacitors in bank A is read out and various other operations such as a reset, followed by a precharging of the rotating capacitors to a specified value, turning on the feedback charge accumulation structure, etc. A fifth timing trace 1167 displays the "SBZ" signal. The SBZ signal performs the operations associated with the SAZ signal for the rotating capacitor bank B.

A seventh timing trace 1171 displays the "CTL_D" signal used to couple the rotating capacitor bank to the buffer capacitor, $C_B$ (discussed in FIG. 8), allowing the charge from the rotating capacitors to be shared with the buffer capacitor, resulting in the voltage on the rotating capacitors appearing on the output of the buffer. The "CTL_D" signal is sometimes referred to as the DUMP signal.

An eighth timing trace 1173 displays the "CTL_R" signal used to couple an inactive rotating capacitor bank (the one that is not currently integrating the RF current) to electrical ground. The "CTL_R" signal is commonly referred to as the RESET signal. A ninth timing trace 1175 displays the "CTL_PB" signal used to couple a feedback capacitor, $C_F$, to rotating capacitor bank B, while a tenth timing trace 1177 displays the "CTL_PA" signal used to couple a different feedback capacitor, $C_F$, to rotating capacitor bank A. For example, the "CTL_PA" and "CTL_PB" signals are used to control the switches 1065 and 1070 from FIG. 10b.

An eleventh timing trace 1179 displays the "CTL_FB" signal used to allow the feedback capacitor, $C_F$, to integrate the feedback current, $i_{fbck}$, intended for rotating capacitor bank B. A twelfth timing trace 1181 displays the "CTL_FA" signal, performing the same operation as the "CTL_FB" signal except for rotating capacitor bank A. For example, the "CTL_FA" and "CTL_FB" signals are used to control the switches 1055 and 1060 from FIG. 10b.

Taking a closer look at the charge dump, reset, and precharge timing curves to provide a better understanding of the timing involved in these operations. Starting at the first pulse (at the left side of FIG. 11c) of the "CTL_D" curve 1171, for example, when the "CTL_D" curve 1171 transitions low, the charge dump switch opens and ends the charge read out of the selected rotating capacitor bank. After the first pulse of the "CTL_D" curve 1171 transitions low, the "CTL_R" curve 1173 transitions high, resulting in the resetting (removal) of any residual charge on the selected rotating capacitor bank. Once the "CTL_R" curve transitions back low, the "GTL_PB" curve 1175 transitions high, resulting in the charge sharing of the accumulated charge with the selected rotating capacitor bank. Subsequent to the transition of the "CTL_PB" curve 1175 back low, the "CTL_FB" curve 1179 transitions high to enable the integration of the $i_{fbck}$ current by the feedback capacitor. Additionally, the "CTL_R" curve 1173 transitions high to reset residual charges on the other rotating capacitor bank and then the "CTL_PA" curve 1177 transitions high to share the charge accumulated on a feedback capacitor with a rotating capacitor bank. Notice that the curves "CTL_FB" 1179 and "CTL_FA" 1181 are essentially complementary (with exception of small non-overlapping periods) to ensure that the charge sharing between the two sets of rotating capacitor banks and feedback capacitors are exclusive.

Figure 12:
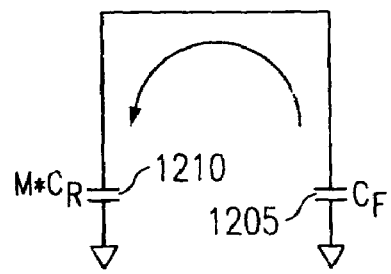
FIG. 12 illustrates the charge sharing between a feedback capacitor and a rotating capacitor according to a preferred embodiment of the present invention.

Referring now to FIG. 12, a diagram illustrates the movement of the charge from a feedback capacitor 1205 to the rotating capacitors 1210 in the selected rotating capacitor bank according to a preferred embodiment of the present invention. Note that the rotating capacitors in the rotating capacitor bank are displayed as a single merged capacitor with an overall capacitance of $M*C_R$, where M is the number of capacitors in the selected rotating capacitor bank and $C_R$ is the capacitance of each rotating capacitor. According to a preferred embodiment of the present invention, each rotating capacitor bank has four (M=4) rotating capacitors and the value of the feedback capacitor 1205, $C_F$, is much greater than the value of the value of each one of the rotating capacitors, $C_R$, with the ratio of $C_F/C_R$ preferably being on the order of 30. Therefore, the once the charge has equalized between the feedback capacitor 1205 and the rotating capacitor bank 1210, the feedback capacitor 1205 has a charge (Q) of:

$$\frac{C_F}{C_F + MC_R} Q_{CF} = \frac{30 C_R}{30 C_R + 4 C_R} Q_{CF} = 0.88 Q_{CF}$$

or 88 percent of its original charge, where $Q_{CF}$ is the original charge on the feedback capacitor, $C_F$. Notice that the small reduction in the charge on the feedback capacitor is due to its relatively large capacitance with respect to the capacitance of the rotating capacitors. However, it is also not practical to have a $C_F/C_R$ ratio that is extremely large (on the order of 100 or more), due to difficulties involved with fabricating capacitors with extremely large capacitance ratios.

After the feedback capacitor, $C_F$, has shared its charge with the selected bank of rotating capacitors, the precharge unit is decoupled from the sampling unit and the feedback capacitor is restored to its original charge levels in preparation for the next time it is to precharge the rotating capacitors. Notice however, that the feedback capacitor has lost only twelve (12) percent of its original charge (based on the exemplary case with a $C_F/C_R$ ratio of 30 and M equal to 4). Therefore, to bring the feedback capacitor back to full charge requires only enough current to bring the feedback capacitor from 88 percent of full charge to full charge, not from zero (0) charge to full charge. Previously, it has been fairly typical to reset the charge on all capacitors involved in the charge sharing to the zero (0) charge state. By resetting the charge to zero, it is easier to calculate the needed amount of current and charging time to bring the capacitors to the desired charge.

Figure 13:
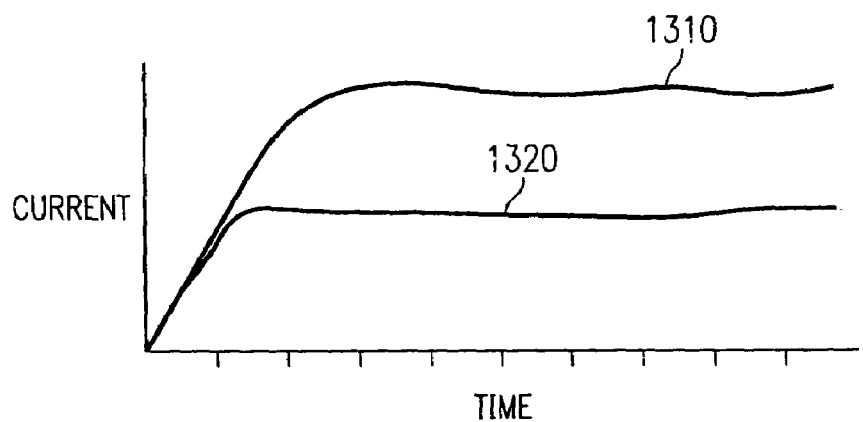
FIG. 13 illustrates the charging current required to refresh the charge on a feedback capacitor after charge sharing using both a prior art technique and a preferred technique according to a preferred embodiment of the present invention.

Referring now to FIG. 13, a graph displays the current needed to place a bias voltage of desired value onto a history capacitor through charge sharing with a feedback capacitor with and without resetting the residual charge on the feedback capacitor according to a preferred embodiment of the present invention. A first curve 1310 displays the amount of current as a function of time needed to place a desired bias current on a history capacitor through the use of charge sharing with a feedback capacitor when the feedback capacitor is reset after each time that it is used to share its charge with the history capacitor. Due to the fact that any residual charge is lost, a relatively large amount of current is required to bring the feedback capacitor from its initial charge value of zero to the required amount of charge.

A second curve 1320 displays the amount of current as a function of time needed to place a desired bias current on a history capacitor through the use of charge sharing with the feedback capacitor when the residual charge on the feedback capacitor is maintained after each time it is used to share its charge with the history capacitor. Since there is a non-zero charge on the feedback capacitor, the amount of current needed to restore the charge on the feedback capacitor to the required charge is less. Additionally, according to a preferred embodiment of the present invention, the capacitance of the feedback capacitor is significantly larger than the capacitance of the rotating capacitors (on the order of 30 or more), the amount of charge lost during each charge sharing operation is small. The amount of charge lost is discussed previously.

The curves displayed in FIG. 13 can be generated by solving for $i_{fbck}$ in expression (4), which was discussed previously. Notice also that the curves in FIG. 13 are not to scale and the actual magnitudes of the actual charging currents used to charge the feedback capacitors may be different. However, the graph does display that there may be a significant difference in the amount of current needed to bring the feedback capacitor to full charge when it is at 88 percent full as opposed to being completely discharged. This significant reduction in the charging current leads to a large reduction in power consumption since the feedback capacitors must be recharged frequently. For example, if the current-mode sampling mixer is intended for use in a Bluetooth communications system, the LO will be generating a 2.4 GHz clock, with four rotating capacitors per bank, the two feedback capacitors per signal path will require charging: 2.4 GHz/4/2=300 MHz, or 300 million times a second. Additionally, there are four signal paths per mixer. Therefore, any reduction in the charging current can result in a large overall reduction in the power consumption. Also, whenever switches are switched, current sources are turned on and off, and current injected into the system, noise is introduced. Hence, an added benefit of the present invention is an overall reduction in the amount of noise injected into the mixer. Notice that the plots show minor variations in the charging currents once the charging algorithm has reached steady state. The variations may be the result of the feedback control unit adjusting the charge on the feedback capacitor to properly set the bias voltage.

Alternatively, rather than bringing the feedback capacitor back to a full charge after it shares its charge with the rotating capacitor bank, the charge on the feedback capacitor may be brought to a different charge level. Reasons for this include the detection of a different DC offset on the outputs of the filter that require special compensation, or for performance reasons, it is not desired to bring the feedback capacitor's charge back to pre-charge sharing levels.

Variables in the manufacturing process may lead to significant variations in the nominal values of circuit components in integrated circuits. For example, different fabrication runs may lead to variations of up to 30 percent difference, plus or minus, from the nominal value of circuit components such as capacitors, resistors, etc. Typically, the wide variation is not seen between circuits from the same fabrication run, but between circuits from different fabrication runs and fabrication plants. Therefore, it is not feasible to simply fix values and amounts such as the charging current, etc. It is preferred that the mixer be able to make adjustments to conform to whatever value its internal components happen to be.

According to a preferred embodiment of the present invention, it is possible to determine the necessary amount of charging current needed to provide the desired bias voltage across the rotating capacitors (using expressions (1–4) discussed previously. For example, should the capacitance of the rotating capacitors be significantly different from the nominal value of the rotating capacitor, a similar amount of charge shared from the feedback capacitor would result in a significantly different bias voltage on the rotating capacitors. Additionally, if, due to manufacturing differences, the value of the feedback capacitor were smaller than its nominal value, then a fixed charging current would result in a larger voltage on the feedback capacitor than desired. This in turn, would result in a precharging of the rotating capacitors to a bias voltage that is greater than desired.

As an alternative to the use of expression (4) to calculate the amount of time required to place a desired bias voltage onto the history capacitor, an iterative approach can be used to more rapidly and accurately place a desired bias voltage onto the history capacitor. Referring back to FIG. 10a, wherein the FCU 1025 uses the outputs of the precharge unit 1015 and/or the filter 1020 to calculate what is known as a direct current (DC) offset of the signals produced by the two units. The DC offset of the signals is then used by the FCU 1025 to control the current source 1052 (FIG. 10b), such as a current-mode DAC, and specify the amount of current used to charge the feedback capacitor, $C_F$, in the precharge unit 1015. Alternatively, the DC offset is provided directly to the current source 1052 and the current source 1052 makes adjustments to the amount of current it provides to the feedback capacitor. Through several iterations of the measure the DC offset and specify the current steps, the FCU 1025 will be able to determine the proper amount of current to develop the desired amount of bias voltage on the rotating capacitors.

The iterative calibration procedure outlined above may be performed each time the system containing the radio transceiver is powered up, for example. Alternatively, if the results of previous calibration procedures are saved to memory and then retrieved when a calibration is needed, then the iterative calibration procedure may not need to be performed (or a highly protracted procedure is performed). In yet another alternative, the FCU 1025 measures the DC offset in the signal streams produced in the precharge 1015 and/or filter 1020 units and makes adjustments (if any) in the signals it is providing to the current source 1052. The current source 1052 would then change the amount of charging current that it provides to the feedback capacitor. With a different amount of charge stored in the feedback capacitor, a different amount of charge would be shared with the rotating capacitors during the precharge operation, resulting in a different bias voltage. With a different bias voltage on the rotating capacitors, the samples of the RF current produced by the rotating capacitors will have a different DC offset. The DC offset is then calculated by the FCU 1025 and the adjustment continues until the desired DC offset is attained.

Figure 14:
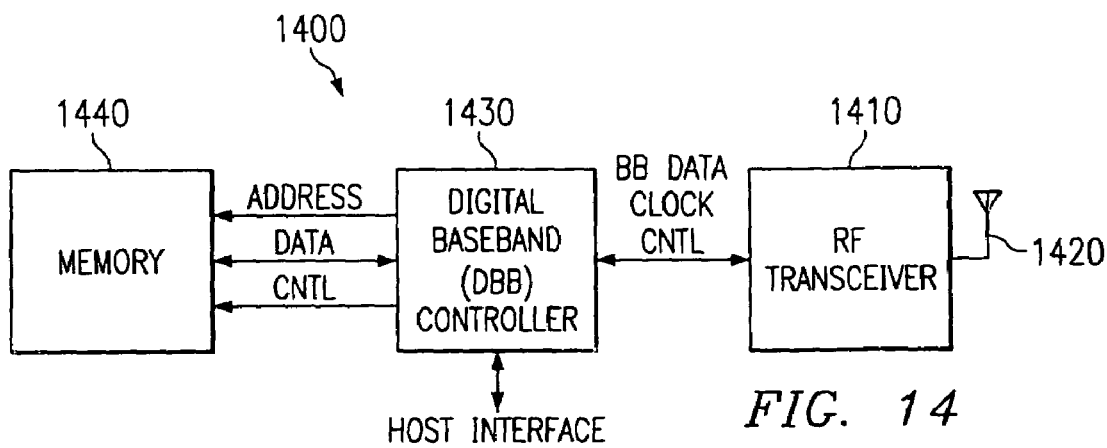
FIG. 14 illustrates a wireless communications device containing a direct sampling mixer according to a preferred embodiment of the present invention.

Referring now to FIG. 14, a block diagram illustrates a wireless communications device 1400 containing a direct sampling mixer according to a preferred embodiment of the present invention. As discussed previously, the direct sampling mixer of the present invention is operable at any radio frequency and with any data encoding and transmission mechanism. In actuality, the direct sampling mixer is also operable in a wired communications system as well.

The direct sampling mixer of the present invention is contained in an RF transceiver 1410 that is coupled to an antenna 1420. The antenna 1420 is responsible for receiving analog RF signals transmitted over-the-air. Additionally, the antenna 1420 may be used to transmit analog RF signals originating from the wireless device 1400. The RF transceiver 1410 is responsible for taking the analog RF signals received by the antenna 1420 and converting it into a digital data stream that is usable by the remainder of the wireless device 1400. Since the RF transceiver 1410 can transmit signals as well as receive them, the RF transceiver 1410 is also responsible for converting a digital data stream into an analog signal suitable for transmission.

After the RF transceiver 1410 receives and then converts the analog RF signal into a digital data stream, the digital data stream is transferred to a digital baseband (DBB) controller 1430. The DBB controller 1430 is responsible for taking the digital data stream and performs any necessary digital signal processing on it to convert the digital data stream in to a stream of user usable data. Examples of the processing performed by the DBB controller 1430 may include, but is not limited to: digital filtering, data encoding and decoding, error detection and correction, and communications protocol software stacks and applications. The DBB controller 1430 is coupled to a memory 1440 that may contain a read-only memory (ROM), a random access memory (RAM), flash programmable memory, etc. The memory 1440 can be used to store necessary subroutines used in the DBB controller 1430, configuration data, scratch memory, etc.

The DBB controller 1430 may be coupled to some other digital device via a host interface. The host interface may be a proprietary interface or it may be adherent to an interconnection standard such as: RS-232, universal serial bus, Firewire, IEEE 802.11, PCcard, etc. The host interface allows the connection of a digital device to the wireless device 1400 via the DBB controller 1430. Examples of digital devices include computers, personal digital assistants, multi-media devices, Internet appliances, storage devices, etc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for setting a voltage on a sampling capacitor comprising:
   applying a first substantially constant charging current to a charging capacitor for a first period of time, to store a first charge on the charging capacitor;

using the charging capacitor to share the first charge with the sampling capacitor, and leaving a residual charge on the charging capacitor;

maintaining the residual charge on the charging capacitor after the using step; and applying a second charging current to the charging capacitor for a second period of time to bring the charge on the charging capacitor from the residual charge to a second charge.

2. The method of claim 1, wherein the first charge is equal to the second charge.

3. The method of claim 1, wherein the first charging current is equal in magnitude to the second charging current.

4. The method of claim 1, wherein the first charging current comprises a first sequence of current pulses.

5. The method of claim 4, wherein the current pulses of the first sequence of current pulses are equal in magnitude.

6. The method of claim 4, wherein the current pulses of the first sequence of current pulses are periodic.

7. The method of claim 1, wherein the using step comprises:

coupling the charging capacitor to the sampling capacitor; and permitting a portion of the charge on the charging capacitor to move to the sampling capacitor.

8. The method of claim 1, wherein the sampling capacitor comprises a capacitor bank with a plurality of rotating capacitors.

9. The method of claim 8, wherein each rotating capacitor in the capacitor bank is of equal capacitance.

10. The method of claim 9, wherein the ratio of charging capacitor capacitance to each rotating capacitor capacitance is greater than about thirty (30).

11. The method of claim 8, wherein the sampling capacitor further comprises a history capacitor.

12. The method of claim 1, wherein the charge shared with the charging capacitor produces a voltage drop on the sampling capacitor 13. The method of claim 12, wherein the sampling capacitor further comprises a history capacitor, and a voltage drop on the rotating capacitors is the same as the voltage drop on the history capacitor.

14. The method of claim 1, wherein the ratio of charging capacitor capacitance to sampling capacitor capacitance is greater than about thirty (30).

15. The method of claim 1, wherein the ratio of charging capacitor capacitance to sampling capacitor capacitance is equal to about thirty (30).

16. The method of claim 1, wherein the second charging current is substantially constant.

17. A method for providing a charge to a charging capacitor comprising:

applying a first charging current to the charging capacitor for a first period of time, to store a first charge on the charging capacitor:

using the charging capacitor to share the first charge with a sampling capacitor, and leaving a residual charge on the charging capacitor;

maintaining the residual charge on the charging capacitor after the using step; and applying a second charging current to the charging capacitor for a second period of time to bring the charge on the charging capacitor from the residual charge to a second charge, wherein the second charging current comprises a second sequence of current pulses.

18. The method of claim 17, wherein the first charging current comprises a first sequence of current pulses, and the current pulses of the first and second sequences are equal in magnitude and are periodic.

19. A method for providing a charge to a charging capacitor comprising:

applying a first charging current to the charging capacitor via a current-mode digital-to-analog converter (DAC) for a first period of time, to store a first charge on the charging capacitor;

using the charging capacitor to share the first charge with a sampling capacitor, and leaving a residual charge on the charging capacitor;

maintaining the residual charge on the charging capacitor after the using step; and applying a second charging current to the charging capacitor via a current-mode digital-to-analog converter (DAC) for a second period of time, to bring the charge on the charging capacitor from the residual charge to a second charge.

20. A method for precharging a sampling capacitor comprising:

placing a first charge on a charging capacitor via current integration;

coupling the charging capacitor to the sampling capacitor, such that the first charge on the charging capacitor is shared with the sampling capacitor, and such that a residual charge is left on the charging capacitor;

decoupling the charging capacitor after charge sharing is complete; and restoring the charge on the charging capacitor from the residual charge back to a level equal to a second charge.

21. The method of claim 20 further comprising the step of repeating the coupling, decoupling, and restoring steps.

22. The method of claim 20, wherein a charging current is used to place a charge on the charging capacitor.

23. The method of claim 22, wherein the charging current is a sequence of current pulses.

24. The method of claim 23, wherein the sequence of current pulses is periodic.

25. The method of claim 20, wherein the first and second charges are equal.

26. The method of claim 20, wherein the first and second charges are different.

27. A method for precharging a sampling capacitor comprising:

measuring a direct current (DC) offset on a signal stream;

determining the first charge based on the measured DC offset;

placing a first charge on a charging capacitor;

coupling the charging capacitor to the sampling capacitor, such that the first charge on the charging capacitor is shared with the sampling capacitor, and such that a residual charge is left on the charging capacitor;

decoupling the charging capacitor after charge sharing is complete; and restoring the charge on the charging capacitor from the residual charge back to a level equal to a second charge.

28. The method of claim 27, wherein the DC offset is periodically measured and the first charge is adjusted based on the measured DC offset.

29. The method of claim 27, wherein the first charge is determined based on a desired amount of DC offset on the signal stream.

30. A circuit for precharging a rotating capacitor comprising:

a feedback control unit (FCU), the FCU containing circuitry to measure a direct current (DC) offset present in a signal stream;

a precharge unit coupled to the FCU, the unit comprising:
  a digital-to-analog converter (DAC) coupled to the FCU, the DAC containing circuitry to convert commands from the FCU into a charging current;
  a feedback capacitor coupled to the DAC, the feedback capacitor to hold a charge by integrating the charging current;

a bank of rotating capacitors coupled to the precharge unit, the bank of rotating capacitors to sample a radio frequency (RF) current to provide the signal stream;

wherein the bank of rotating capacitors is periodically coupled to the precharge unit and the charge on the feedback capacitor is shared with each rotating capacitor in the bank of rotating capacitors, providing a charge on each of the rotating capacitors;

wherein the charge sharing with the bank of rotating capacitors depletes a portion of the charge on the feedback capacitor; and wherein the charge on the feedback capacitor is refreshed to a second charge level with the charging current from the DAC.

31. The circuit of claim 30, wherein the DAC is a sigma-delta current-mode DAC.

32. The circuit of claim 30 further comprises a filter unit coupled to the bank of rotating capacitors and the FCU, the filter unit containing circuitry to remove undesired noise from the signal stream.

33. The circuit of claim 30, wherein the FCU periodically measures the signal stream to measure the DC offset and changes its commands to the DAC to adjust the charging current.

34. A radio receiver comprising:
  a radio frequency (RF) input to receive RF signals;
  a current-mode sampling mixer coupled to the RF input, the mixer comprising:
    a feedback control unit (FCU), the FCU containing circuitry to measure a direct current (DC) offset present in a signal stream;
    a precharge unit coupled to the FCU, the unit comprising:
      a digital-to-analog converter (DAC) coupled to the FCU, the DAC containing circuitry to convert commands from the FCU into a charging current;
      a feedback capacitor coupled to the DAC, the feedback capacitor to hold a charge by integrating the charging current;
    a bank of rotating capacitors coupled to the precharge unit, the bank of rotating capacitors to sample a radio frequency (RF) current to provide the signal stream;
  a signal processing unit coupled to the mixer, the signal processing unit containing circuitry to process the signal streams produced by the mixer and create user usable data;

wherein the bank of rotating capacitors is periodically coupled to the precharge unit and the charge on the feedback capacitor is shared with each rotating capacitor in the bank of rotating capacitors, providing a charge on each of the rotating capacitors;

wherein the charge sharing with the bank of rotating capacitors depletes a portion of the charge on the feedback capacitor; and wherein the charge on the feedback capacitor is refreshed to a second charge level with the charging current from the DAC.

35. The radio receiver of claim 34, wherein the receiver is used in a wireless communications network.

36. The radio receiver of claim 35, wherein the wireless communications network is a Bluetooth compliant network.

37. The radio receiver of claim 35, wherein the wireless communications network is a cellular based communications network.

38. A circuit comprising:
  a switched current source to produce a controllable charging current;
  a pair of feedback capacitors selectively coupled to the switched current source, each feedback capacitor to integrate the charging current provided by the switched current source; and
  a pair of switches, one switch coupled to each feedback capacitor, the switches to selectively couple the feedback capacitors to a pair of rotating capacitors.

39. The circuit of claim 38, wherein the switched current source is a current-mode digital-to-analog converter (DAC).

40. The circuit of claim 38, wherein only one feedback capacitor integrates the charging current at a given time.

41. The circuit of claim 38, wherein each feedback capacitor is coupled to a different rotating capacitor.

42. The circuit of claim 38, wherein each rotating capacitor is a bank of M rotating capacitors, where M is an integer number greater than one.

43. A method, comprising the steps of:
  producing a controllable charging current with a switched current source;
  selectively coupling a pair of feedback capacitors to the switched current source, each feedback capacitor to integrate the charging current provided by the switched current source; and
  selectively coupling the feedback capacitors to a pair of rotating capacitors with a pair of switches, one switch coupled to each feedback capacitor.

* * * * *